United States Patent [19]

Aslan

[11] Patent Number: 4,611,166
[45] Date of Patent: Sep. 9, 1986

[54] RADIATION HAZARD DETECTOR

[75] Inventor: Edward E. Aslan, Plainview, N.Y.

[73] Assignee: The Narda Microwave Corporation, Hauppauge, N.Y.

[21] Appl. No.: 451,040

[22] Filed: Dec. 20, 1982

[51] Int. Cl.$^4$ .................. G01R 21/04; G01R 5/22; G01R 21/10; G01R 19/22

[52] U.S. Cl. .................. 324/95; 324/72.5; 324/106; 324/119; 343/703

[58] Field of Search .......... 324/95, 72.5, 119, 72, 324/106; 343/703; 340/600; 455/67

[56] References Cited

U.S. PATENT DOCUMENTS

| | | | |
|---|---|---|---|
| 3,130,368 | 4/1964 | Hoover | 324/96 X |
| 3,360,726 | 12/1967 | Peters, Jr. | 324/119 |
| 3,696,206 | 10/1972 | Ida et al. | 381/56 X |
| 3,919,638 | 11/1975 | Belden, Jr. | 324/95 |
| 3,927,375 | 12/1975 | Lanoe et al. | 340/600 |
| 4,207,518 | 6/1980 | Hopfer | 324/95 |
| 4,277,744 | 7/1981 | Audone et al. | 324/72 |
| 4,392,108 | 7/1983 | Hopfer | 324/95 |

FOREIGN PATENT DOCUMENTS 1421365  1/1976  United Kingdom .................. 324/95

OTHER PUBLICATIONS

Naval Surface Weapons Center, Contract Specification Test Set, Non-Ionizing Radiation Hazard (RADHAZ) Instrumentation, Jan. 1982.

Primary Examiner—Stewart J. Levy
Assistant Examiner—Stephen M. Baker
Attorney, Agent, or Firm—Eisenman, Allsopp & Strack

[57] ABSTRACT

An electromagnetic field detector adapted to display potential hazard to humans and other animals arising from illuminating electromagnetic energy over the frequency range determined to be hazardous by the American National Standards Institute; the detector being designed with various sensing means to create a sensitivity vs. frequency response that is the inverse of the A.N.S.I. protection guides.

11 Claims, 14 Drawing Figures

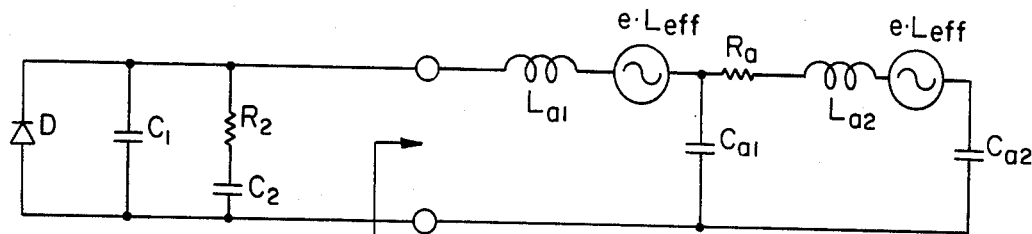
DIPOLE
LUMPED EQUIVALENT CIRCUIT OF LOW FREQUENCY DIPOLE
FIG.5
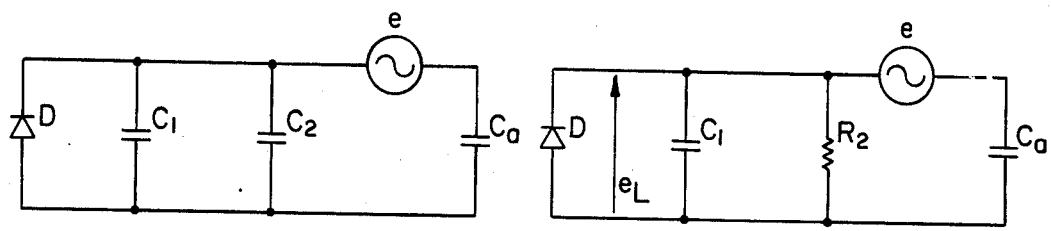
BELOW 3 MHz EQUIVALENT CIRCUIT
FIG.6
3-30 MHz EQUIVALENT CIRCUIT
FIG.7
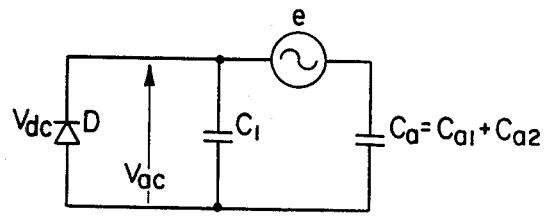
30-300 MHz EQUIVALENT CIRCUIT
FIG.8
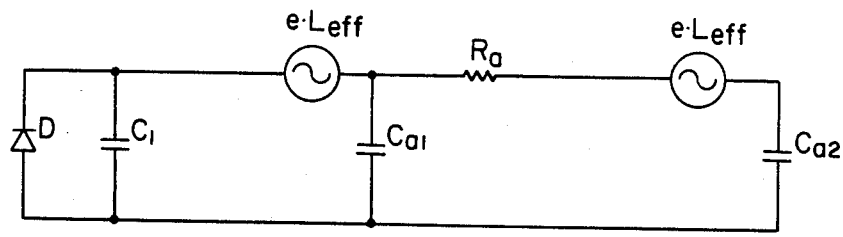
300-1500 MHz EQUIVALENT CIRCUIT
FIG.9

RADIATION HAZARD DETECTOR

BACKGROUND OF THE INVENTION

1. Field of the Invention

This invention relates to electromagnetic field detectors and more particularly, to instruments suitable for monitoring radiation of electric fields and displaying the potential hazard such fields may have, to humans or other animals.

2. Description of the Prior Art

It is recognized that radio frequency and microwave fields may have harmful effects to humans and other animals. The American National Standards Institute (A.N.S.I.) has developed standard safety levels with respect to human exposure to electromagnetic fields in the frequency range from 300 KHz to 100 GHz. An explanation of these standards appears in the October 1982 Bioelectromagnetics Newsletter published by the Bioelectromagnetics Society. According to these standards, protection guides are established to limit exposure conditions to safe specific absorption rates.

Obviously, in order to determine whether or not energy is within prescribed safety levels, it is necessary to monitor the energy level of the illuminating fields. However, the frequency range of importance is beyond the known range of any one type of sensing device presently used. The essential components of instruments capable of monitoring radiation, are the electrical field sensitive elements. Their characteristics, structure, and interconnection determine their sensitivity to the illuminating fields. Thermocouples and semiconductor diodes are common sensing elements. It has been recognized that each type of element, while having inherent advantages and limitations, also exhibits frequency limitations. Thus for example, diode sensors have been shown to operate most effectively at lower frequencies, e.g. below 1.5 GHz, while thermocouple sensors operate most effectively at higher frequencies, e.g. above 300 MHz.

The inventor's copending application, filed concurrently herewith, describes an ultra-broadband radiation monitor combining diode and thermocouple sensors. As explained therein, it is known that diodes are most effective when applied in conjunction with the high reactance of electrically short dipole antennas. In contrast, the best sensitivity of thermocouple elements is achieved when low resistivity materials are employed in a thin-film configuration in conjunction with low reactance dipoles. There are other recognized characteristics which lead to corresponding limitations.

One form of effective high frequency field measuring equipment is shown in the inventor's U.S. Pat. Nos. 3,641,439 and 3,794,914, issued on Feb. 9, 1972 and Feb. 26, 1974, respectively. These patents disclose a near-field radiation monitor utilizing thin-film thermocouples positioned in quadrature to measure relatively high frequency electric fields.

As further described in the inventor's article BROAD-BAND ISOTROPIC ELECTROMAGNETIC RADIATION MONITOR, published in the November 1972 I.E.E.E. Transactions on Instrumentation and Measurement, one may utilize sensors of the general type described mounted along three mutually orthogonal axes in order to achieve isotropic performance. On the other hand, to date, no suitable equipment is known to be available that is designed to monitor electromagnetic fields over the broad frequency range contemplated herein, and produce a display that indicates the effect of the field as a function of the energy content of the various frequencies present.

SUMMARY OF THE INVENTION

The present invention, in a particular embodiment, comprises a monitoring unit responsive to an illuminating electromagnetic field to produce signals that are a function of the potential hazard inherent in the field strength. The American National Standards Institute has found that for mixed or broadband fields at a number of frequencies for which there are different levels of safe absorption, the fraction of the safe levels incurred within each frequency interval should be determined and the sum of all such fractions should not exceed 100%.

The A.N.S.I. standards, set forth in graphical form hereafter, indicate that safe exposure levels for humans vary considerably over the relevant frequency range. Thus, while monitoring systems of constant sensitivity would yield output signals proportional to the illuminating field energy, these output signals would have to be interpreted as a function of the defined safe absorption levels for each detected frequency. This would lead to numerous charts or meter scales for each detected frequency and/or special summing arrangements where various frequency intervals are involved.

The present invention uses thin-film thermocouple sensors and diode sensors mounted on a single probe. The outputs of the sensors are summed to provide a true indication of power density over the complete range of frequency being monitored. The sensitivity of each sensor is patterned to create an inverse sensitivity of the A.N.S.I. standard power density vs. frequency curve in the relevant frequency region, to yield outputs that are directly proportional to the safe energy level at all frequencies. These outputs are then electrically summed to drive a meter that displays the degree of hazard inherent in an entire field.

An object of the present invention is to provide an improved portable electromagnetic field detector.

Another object of the invention is to provide a portable radiation hazard detector.

Yet another object of the invention is to provide a portable radiation hazard detector wherein the sensitivity of the sensor elements is adjusted to conform to the inverse of the A.N.S.I. standards for safe power density levels throughout a broad frequency range.

In a preferred embodiment, the invention comprises a probe having at least one set of diode and thermocouple sensors, arranged along a common axis and displaced from one another. The sensors are designed to exhibit varying sensitivity over a frequency range corresponding to that found potentially hazardous to humans, the level of sensitivity being a function of frequency that corresponds to the inverse of the A.N.S.I. standards for safe absorption energy levels vs. frequency.

The invention will be more thoroughly understood and appreciated from the following description which is made in conjunction with the drawings.

BRIEF DESCRIPTION OF DRAWINGS

FIGS. 5, 6, 7, 8, and 9 are lumped equivalent circuits of the diode sensing element of the invention over various impinging frequencies;

DESCRIPTION OF THE PREFERRED EMBODIMENTS

Figure 1:
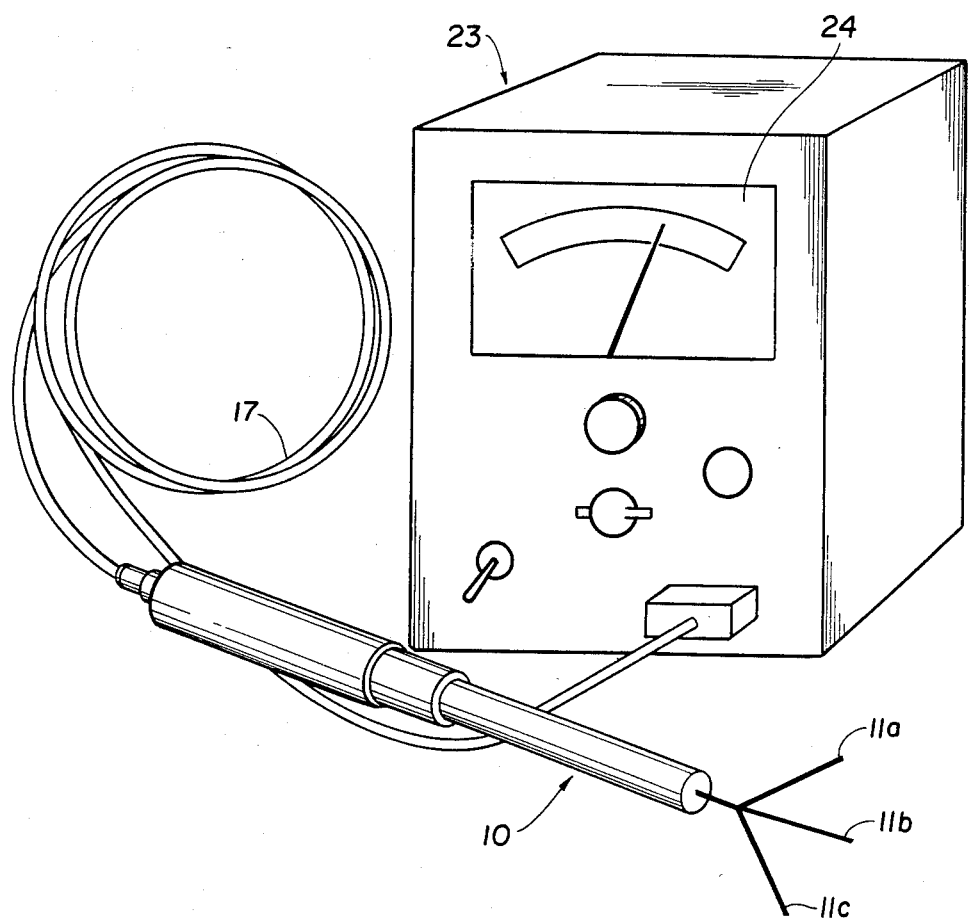
FIG. 1 is a pictorial illustration of an electromagnetic field detector embodying the invention.

The probe 10 shown in FIG. 1, serves to mount the sensors of the invention and also modifies the signals generated therein for transmission over a line 17 to a metering instrument 23. This is explained in greater detail later in the specification. Three sets of sensing elements 11a, 11b, and 11c are supported at one end of probe 10 along mutually orthogonal axes.

Figure 2A:
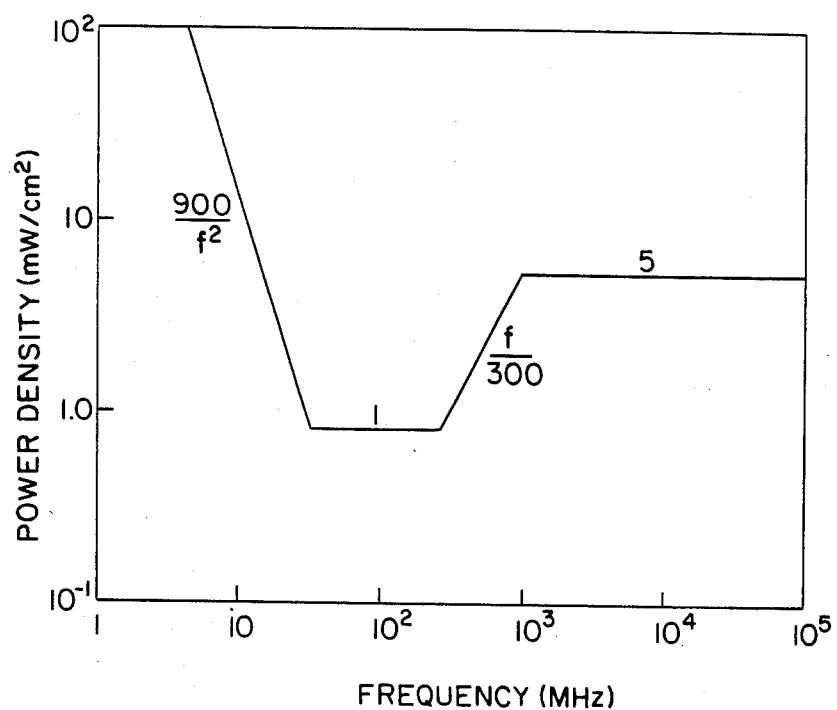
FIG. 2A is a graph plotting power density as a function of frequency, representing the A.N.S.I. radio frequency protection guide for whole-body exposure of human beings.

In essence, the radio frequency protection guides established by A.N.S.I. are:

| Frequency Range (MHz) | Power Density (mW/cm$^2$) | E$^2$ | H$^2$ |
|---|---|---|---|
| 0.3–3 | 100 | 400,000 | 2.5 |
| 3–30 | 900/f$^2$ | 4,000 (900/f$^2$) | 0.025 (900/f$^2$) |
| 30–300 | 1.0 | 4,000 | 0.025 |
| 300–1500 | f/300 | 4,000 (f/300) | 0/025 (f/300) |
| 1500–100,000 | 5.0 | 20,000 | 0.125 | where E$^2$ is the mean squared electric field strength and H$^2$ is the mean squared magnetic field strength. These guides are shown graphically in FIG. 2A.

Figure 2B:
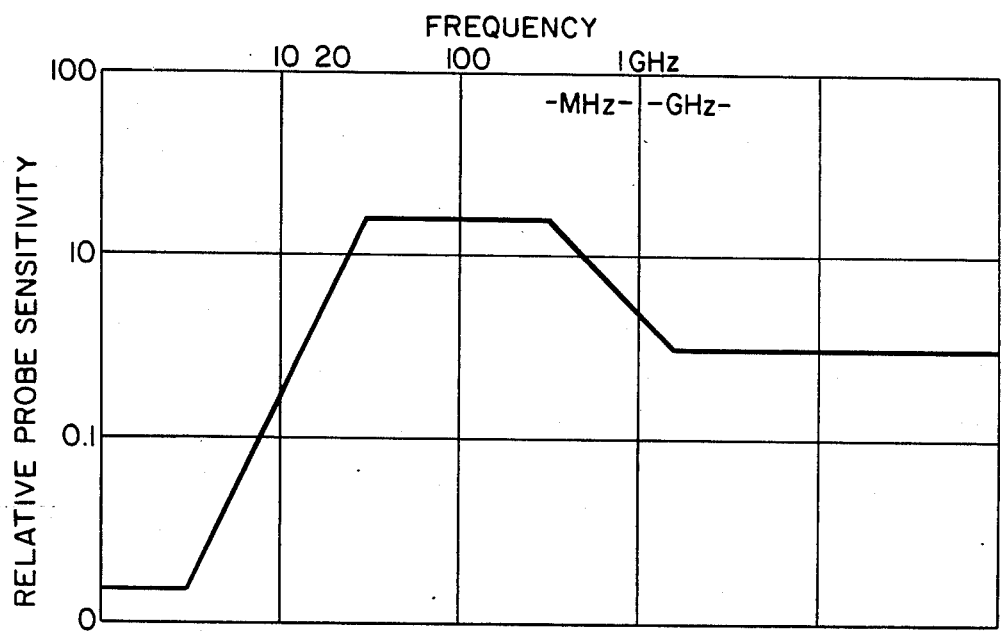
FIG. 2B is a graph plotting relative sensitivity as a function of frequency, of a probe embodying the features of the invention, the frequency scale being logarithmically presented.

By proper selection of sensor elements, the probe of this invention exhibits sensitivity response characteristics shown graphically in FIG. 2B. The signals generated with this sensitivity, are proportional to the potential hazard of the illuminating energy. It will be recalled that the low frequency sensitivity of the monitor described herein is determined by diode sensors while the high frequency sensitivity is determined by thermocouple sensors. In FIG. 2B, the low frequency region is shown to extend generally from 0 through 1.5 GHz and the high frequency region extends generally from 1.5 GHz to 40 GHz and beyond.

Figure 3:
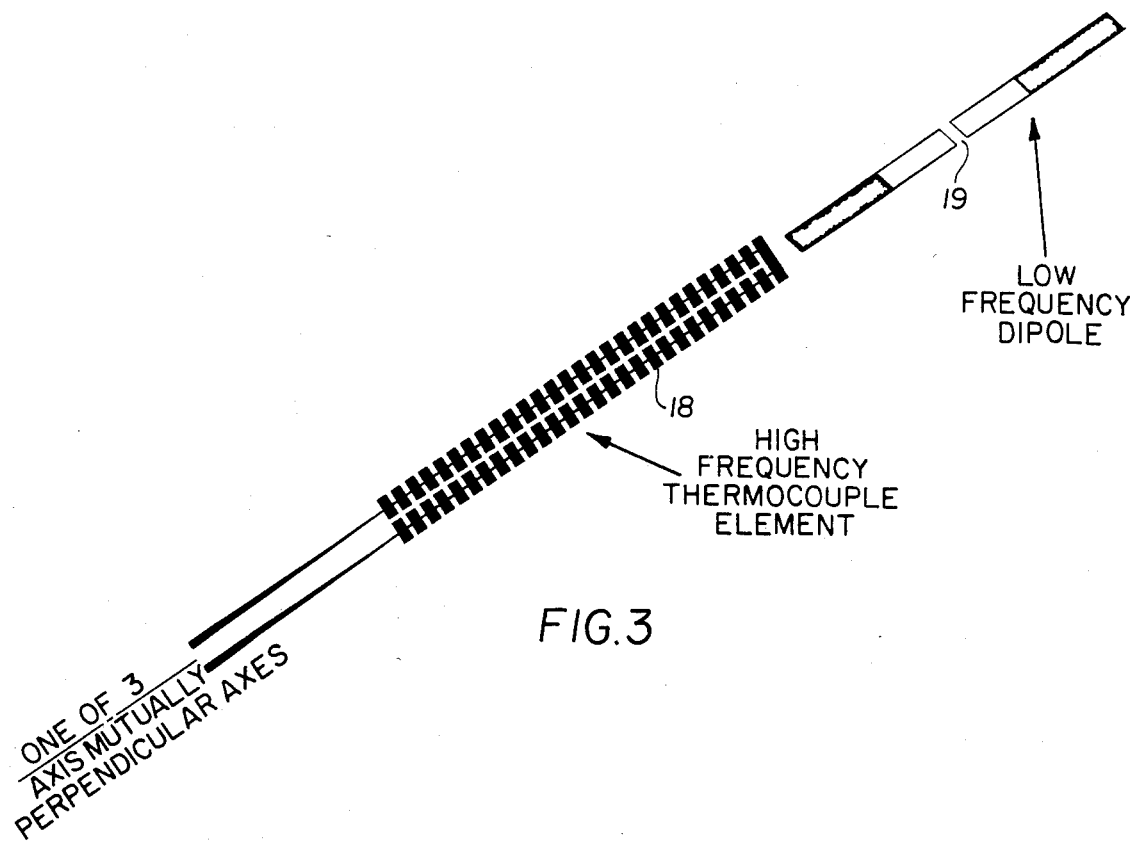
FIG. 3 is an enlarged schematic illustration of a set of sensor elements, aligned and arranged in accordance with a preferred embodiment of the invention.

Before considering in greater detail the specific characteristics of the various sensing elements, a visual appreciation of the elements and their interrelationship will be available from FIG. 3. This figure shows an array of series-connected thermocouple dipoles 18, making up the high frequency sensors, axially aligned with a dipole antenna 19, which serves as the input source for the low frequency diode sensor. Three such sets of sensing elements provide a complete unit for isotropic response of an ultra-broadband of frequencies.

Figure 4A:
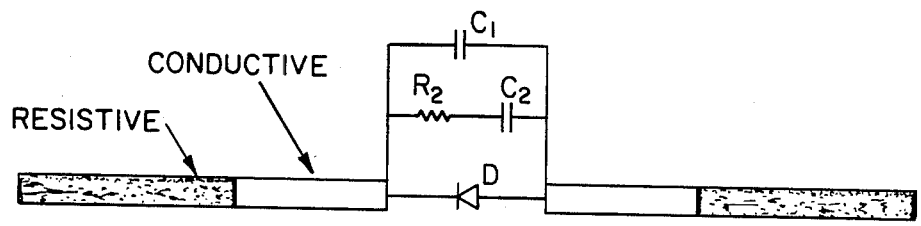
FIGS. 4A, 4B are schematic representations of diode sensing elements in accordance with embodiments of the invention.
Figure 4B:
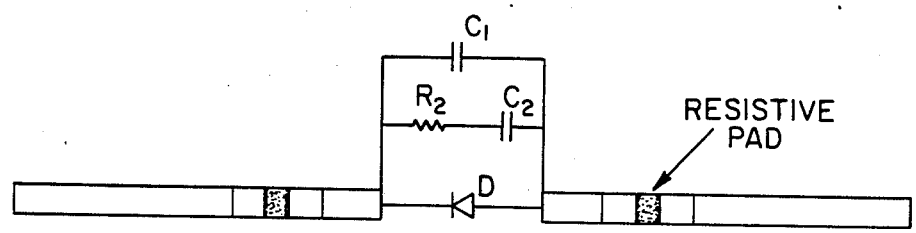

The low frequency diode sensor element is illustrated in FIGS. 4A and 4B, and the lumped equivalent circuit for such a sensor is shown in FIG. 5. The equivalent inductive and capacitive reactance of the dipole segments is illustrated separately as $L_{a1}$, $L_{a2}$ and $C_{a1}$, $C_{a2}$, respectively. When considering the combined effect of such reactances, reference will be made to $L_a$ and $C_a$, respectively. Similarly, the voltage induced in the dipole responsive to illuminating energy is illustrated by separate sources, e. The equivalent resistance of the dipole is illustrated as $R_a$.

In one specific embodiment of the invention, beam lead Schotky diodes were used to minimize connecting loops that might couple to the field and introduce erroneous signals. In addition, the size of the resistive and capacitive components was minimized by use of chip components. Typical values of the components shown in conjunction with the diode sensing element were (with a total dipole length of 3.75 inches): $C_1 = 12$ pfds.; $C_2 = 200$ pfds.; $C_{a1} = 0.1$ pfds.; $C_{a2} = 0.2$ pfds.; $R_2 = 330$ ohms; $R_a = 800$ ohms; $L_{a1} + L_{a2} = 0.036$ mh.

In the frequency range from 30 to 300 MHz, the equivalent circuit simplifies to that shown in FIG. 8 wherein the dipole resistance $R_a$ and dipole inductive reactance of $L_a$ are negligible compared to the dipole capacitive reactance of $C_a$. Within this range, reactance of $C_2$ is selected to be very low, and resistance $R_2$ is selected to be extremely high relative to the reactance of shunting capacitor $C_1$. The dipole capacitance $C_a$ and the shunting capacitance $C_1$ act as a capacitive voltage divider having a uniform output with frequency over this range, the capacitane $C_1$ having been shunted across the diode D to obtain the desired sensitivity.

Descending in frequency and commencing at 30 MHz, the shape of the response is principally controlled by the resistance $R_2$ in conjunction with the reactance of shunting capacitor $C_1$, and the dipole capacitance $C_a$. The equivalent circuit then reduces to the one shown in FIG. 7. The radio frequency voltage across the diode D varies at a 6 db per octave rate as the frequency decreases to 3 MHz. The diode DC output, having a square-law characteristic, provides an output proportional to the square of the radio frequency voltage across the diode. The diode output sensitivity therefore decreases as the square of frequency, f$^2$.

Descending still further in frequency, at approximately 3 MHz the reactance $C_2$ increases to the magnitude where it exceeds the resistance $R_2$ and the equivalent circuit reduces to approximate the schematic of FIG. 6. Hence, the circuit again performs as a capacitive divider having a constant sensitivity with frequencies below 3 MHz.

Within the frequency range above 300 MHz and to 1.5 GHz, the dipole characteristics are selectively modified to achieve controlled roll-off. The dipole is constructed of conductive and resistive portions, as illustrated in FIG. 4A. The conductive portion connects a resistive film portion to the terminals of the diode. The extent and location of the resistive film portion of the dipole is selected to achieve the desired characteristics. When the frequency increases above 300 MHz, the resistance of this film predominates over the reactance of that portion of the antenna. If the entire dipole had been constructed of resistance material, the sensitivity would decrease at a 6 db per octave rate, or 1/f$^2$. To approximate the desired 1/f, 3 db per octave rate, a portion only of the dipole is made resistive, the resistivity in the present case being chosen to start roll-off at 300 MHz. That portion of the conductive dipole contributes a signal to the diode that is constant over the frequency range thereby achieving the desired reduction in sensitivity to approximate 1/f. The diode operates in its square-law region and the induced voltages are made approximately equal for both conductive and resistive portions.

In the low to high frequency transition 300 MHz to 1.5 GHz range, the equivalent circuit of FIG. 5 reduces to that of FIG. 9, where the resistance $R_2$ is much greater than the shunting reactance of $C_1$ and the dipole reactance $L_a$ is negligible.

Under these circumstances the diode output voltage $V_d$ becomes:

$$V_d = k\left[eL_{eff} + \frac{eL_{eff}}{f}\right]^2$$

The response of the diode sensor thus decreases as the frequency increases, but the addition of the output from the higher frequency sensor elements as described hereafter, will produce additional correction. This technique can be modified further by using discrete resistances strategically placed along the dipole length. FIG. 4B illustrates this structure with a single resistive pad $R_P$ on each leg of the dipole.

The resistivity of the dipole and the concomitant decreasing sensitivity, prevents affecting the response in the high frequency region as the dipole approaches resonance. The values of capacitance and inductance for the sections of the dipole can be calculated from the average characteristic impedance for each portion of the dipole. The equation for characteristic impedance $Z_0$ is:

$$Z_o = \frac{1}{H_2 - H_1} \int_{H_1}^{H_2} 120 \ln\left(\frac{2r}{a}\right) dr$$

where $H_1$ and $H_2$ define the limits of each portion of the dipole, and a is the effective radius of the dipole. The equation can then be integrated over the portion of the antenna in question.

Using the expression for $L_a$ and $C_a$:

$$L_a = Z_0(8f_0)^{-1}$$

$$C_a = (\pi^2 f_0 Z_0)^{-1}$$

The thermocouple sensing elements used for the high frequency region, are described and explained structurally in the inventor's aforementioned U.S. Pat. No. 3,641,439 and in his I.E.E.E. article. The probe may consist of three mutually perpendicular broadband probe elements as illustrated in FIG. 1. Broadband characteristics are obtained by distributing resistive thermocouple dipoles along the length of the high frequency sensing element at spacings that will permit no resonant length over the range of frequencies within which the probe is intended to operate. The spacing is less than one-quarter wavelength of the highest frequency to be measured. In effect, the high frequency sensing element may be viewed as a group of series-connected small resistive dipoles or as a very low Q resonant circuit.

Each thermocouple dipole element and/or connected set provides a DC output signal that is proportional to the square of the electric field strength tangential to the element. The elements are preferably thin-film thermocouples that provide true square-law outputs. The DC signal is proportional to the power dissipated in the thermocouple elements and indicates the average energy density in the volume in which the elements are contained. The summation of the DC signals from the three orthogonal sensing elements provides a measure of the total energy or power density, independent of direction or polarization of the RF signals.

Figure 11:
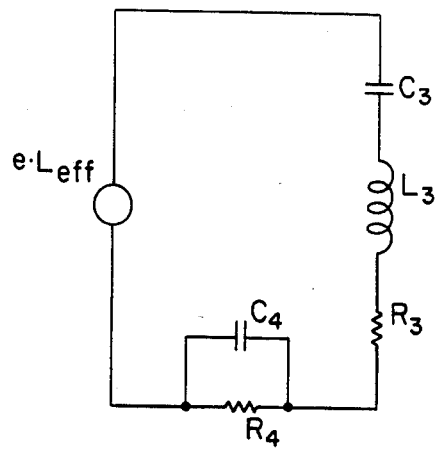
FIG. 11 is the lumped equivalent circuit of a probe with single thermocouple elements relative to a total probe.

A lumped equivalent schematic representation of a thermocouple sensing element is shown in FIG. 11. $L_3$ and $C_3$ are the lumped equivalent inductance and capacitance of the element determined from the average characteristic impedance $Z_0$.

$$C_3 = 2(\pi^2 f_0 Z_0)^{-1}$$

$$L_3 = Z_0(8f_0)^{-1}$$

$f_0$ is the resonant frequency of a dipole of the same length as the element. $R_3$ equals the total resistance of the probe element less $R_4$. $C_4$ is the shunt capacitance across a small dipole and can be determined from the geometry of FIG. 10 as $$C_4 = \pi eL\left[\ln\left(\frac{4D-W}{W}\right)\right]^{-1}$$

The DC output of the small thermocouple dipole is proportional to the power dissipated in it.

Figure 10:
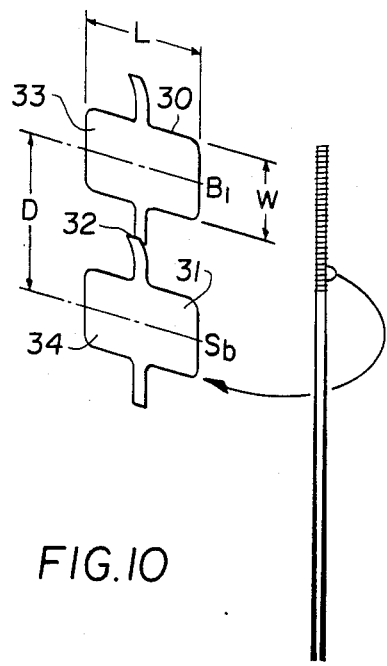
FIG. 10 illustrates a thermocouple sensing element having distributed thermocouple film elements and the geometry thereof.

The resistive dipoles are composed of thin films of overlapping dissimilar resistive films 30, 31, deposited upon a thin plastic substrate. The geometry creates alternate cold and hot junctions. As shown in FIG. 10, the hot junctions are formed at the center 32 of the narrow strips having relatively high resistance thereby allowing for the dissipation of energy and the resultant increases in temperature. The wider sections 33, 34 have a low resistance and thus function as cold junctions, the low resistance allowing little energy to be dissipated within these sections. In addition, the broad area distributes the energy and conducts heat rapidly into the substrate so that very little temperature rise occurs The resultant DC output voltage is directly proportional to the energy dissipated in the resistive portion of the thermocouple.

The spacing "D" between the cold junctions is a small fraction of a millimeter. The close spacing minimizes zero drift due to ambient temperature, since only a very small temperature gradient can occur due to the variation in ambient temperature. Variation in the ambient temperature will cause variation in sensitivity that is less than 0.05 percent/°C., which will not degrade the basic accuracy of the instrument even over wide temperature ranges. The leads that carry DC outputs from the probe elements to the metering instrumentation are high-resistance films and present a high resistance near the probe elements resulting in low current to minimize any interaction of the Dc leads and the probe elements.

The total effect of the structure described is to approximate the condition of the high frequency sensing elements being suspended in space because the leads are transparent to the RF fields. The extremely light coupling into the field, results in very little perturbation of the RF field being measured due to scattering phenomena. A break point of the frequency sensitivity curve is provided at 1.5 GHz at the low frequency end and above 40 GHz at the high frequency end. This yields extremely flat frequency response from 1.5 GHz, while below 1.5 GHz the response decreases at a 6 db/octave rate.

To minimize cross-coupling between the resistive high frequency thermocouple dipole and the low frequency diode connected dipole, each element pair is placed on the same axis, with some spacing between the adjacent ends. FIG. 3 shows the spacial relationship.

Figure 12:
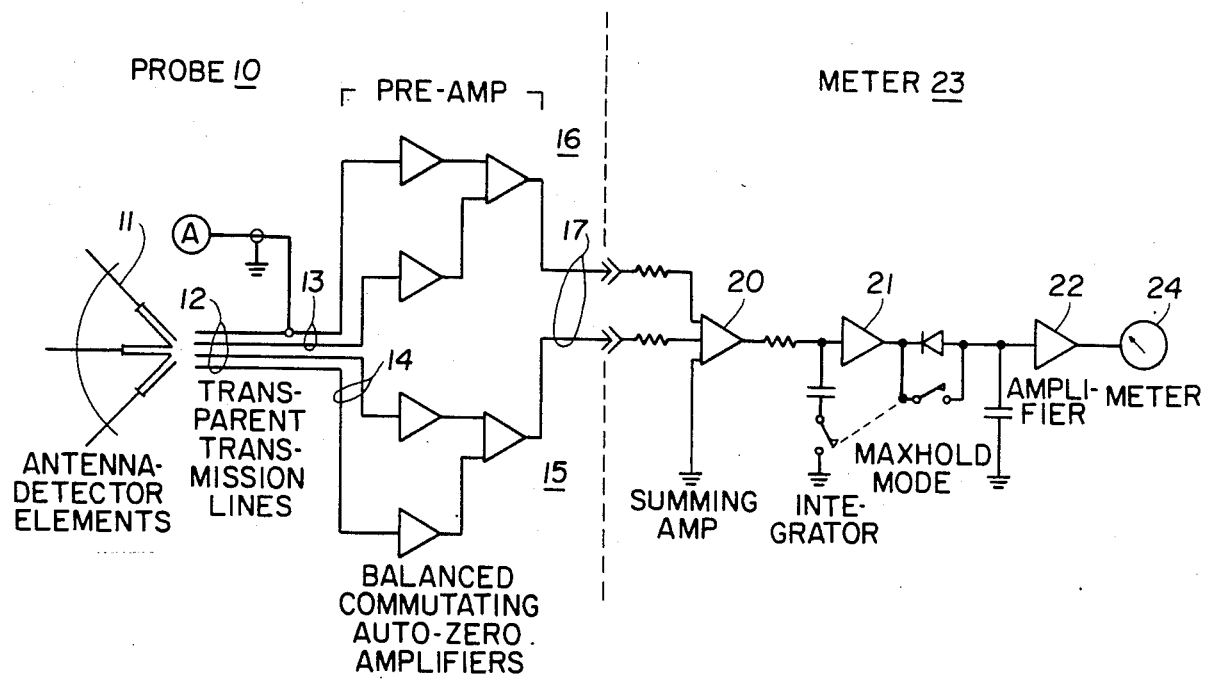
FIG. 12 is a block diagram of an instrument embodying the features of the invention.

FIG. 12 is a block diagram showing the circuitry suitable for converting the output signals of the sensors to a meter display of potential hazard. DC signals from a housing 11 containing suitably mounted high frequency thermocouples and low frequency diode elements, are delivered to a pre-amplifier in the handle of the probe 10, over a high resistivity transmission line 12. A first two-wire DC transmission line 13 is used for the three high frequency elements which are connected in series, as previously explained. A second two-wire DC transmission line 14 is used for the three diode elements which are connected in parallel, as also previously explained. The leads are held rigidly in place to prevent cable modulation. A high resistivity film is advantageously applied over the probe to provide shielding from static charges. The pre-amplifiers utilize balanced instrumentation amplifiers and the resistive transmission line leads are matched to further reduce common mode and static charge induced signals.

The pre-amplifier contains two sections. One section 15 conditions the diode signal and provides temperature compensation and such linearity correction as may be required at the upper extreme of the operating power density range. A gain setting control may be provided for calibration. The conditioning amplifiers 16 for the high frequency thinfilm thermocouple sensors need provide for calibration only, inasmuch as temperature compensation and linearity correction are not necessary. The signals from the pre-amplifiers are transmitted over a conductive cable 17 to a suitable metering instrument.

Within the metering instrument shown in FIG. 12, the two signals from the probe are first combined in a summing amplifier 20. The resultant signal is further processed by a maximum hold amplifier 21. The output of this latter circuit feeds an amplifier 22 which in turn may drive a D'Arsonval meter movement 24 to indicate percent of exposure level.

A particular radiation hazard detector has been described. It is recognized that modifications will be apparent to those skilled in the art. All modifications coming within the teachings of this disclosure are intended to be covered by the following claims.

I claim:

1. A field detector for indicating energy content of an electromagnetic field in accordance with predetermined criteria which establishes the effect of said energy as a function of frequency throughout a range of frequencies, comprising diode sensing means operative over a first portion of said range and thermocouple sensing means operative over a second portion of said range, said sensing means being responsive to said field to produce outputs that are a function of the energy of said field, the outputs of said sensing means being added to produce a control output at a level proportional to said effect at the various frequencies present in said field, and means responsive to said control output to display the effect inherent in said range of frequencies.

2. A field detector as defined in claim 1, wherein said effect is the potential hazard of said energy.

3. A field detector as defined in claim 1, wherein said sensing means are mounted on a probe along a common axis, said diode and thermocouple sensing means being physically and electrically isolated from one another.

4. A field detector as defined in claim 3, wherein said sensing means comprise at least one set of sensing elements, the sensing elements of said set being mounted on a single probe.

5. A field detector as defined in claim 4, wherein the sensing elements within each set include a diode element connected to a dipole responsive to a lower portion of said range of frequencies, and a thermocouple responsive to a higher portion of said range of frequencies.

6. A field detector as defined in claim 4, including three sets of sensing elements, the sensing elements of each set being aligned along a common axis and the common axes of the sets being mutually orthogonal.

7. An electric field sensitive probe comprising a set of sensing elements including a diode sensing element and a thermocouple sensing element, said diode sensing element being connected to a dipole and circuitry to exhibit a predetermined sensitivity to said field over a lower range of frequency, and said thermocouple sensing element exhibiting predetermined sensitivity to said field over a higher range of frequency, said lower and higher ranges being substantially adjacent to one another.

8. An electric field sensitive probe as defined in claim 7, wherein the sensing elements in said set are positioned along a common axis with spacing between adjacent ends.

9. An electric field sensitive probe as defined in claim 7, wherein said sets of sensing elements are each aligned along one of three mutually perpendicular axes.

10. An electric field sensitive probe as defined in claim 9, wherein said diode sensing element comprises a diode connected to a dipole antenna and capacitive means connected in parallel with said diode, said dipole having conductive portions connected to said diode and resistive portions remote from said connections with said diode.

11. An electric field sensitive probe as defined in claim 10, wherein said dipole includes discrete resistive segments interconnected along the length thereof.

* * * * *